(12) United States Patent
Brennan et al.

(10) Patent No.: US 6,700,164 B1
(45) Date of Patent: Mar. 2, 2004

(54) TUNGSTEN HOT WIRE CURRENT LIMITER FOR ESD PROTECTION

(75) Inventors: Ciaran J. Brennan, Essex Junction, VT (US); Kevin A. Duncan, Milton, VT (US); William R. Tonti, Essex Junction, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 09/611,812

(22) Filed: Jul. 7, 2000

(51) Int. Cl.[7] .......................... H01L 23/62; H01L 27/12
(52) U.S. Cl. ................. 257/379; 257/355; 257/358; 257/363; 361/91.1; 361/91.2; 361/56; 361/58
(58) Field of Search ................. 257/379, 355, 257/358, 363; 361/91.1, 91.2, 93.7, 56, 58

(56) References Cited

U.S. PATENT DOCUMENTS

| | | | |
|---|---|---|---|
| 4,890,187 A | * 12/1989 | Tailliet et al. | ............... 361/111 |
| 5,051,860 A | 9/1991 | Lee et al. | |
| 5,227,327 A | 7/1993 | Sasaki | |
| 5,440,163 A | 8/1995 | Ohhashi | |
| 5,604,655 A | * 2/1997 | Ito | ............... 361/56 |
| 5,654,860 A | 8/1997 | Casper et al. | |
| 5,710,452 A | * 1/1998 | Narita | ............... 257/355 |
| 5,717,559 A | * 2/1998 | Narita | ............... 361/56 |
| 5,789,964 A | * 8/1998 | Voldman | ............... 327/380 |
| 5,821,797 A | * 10/1998 | Kinugasa et al. | ............... 327/318 |
| 5,828,107 A | 10/1998 | Narita | |
| 5,844,281 A | 12/1998 | Narita | |
| 5,875,089 A | * 2/1999 | Higashide et al. | ............ 361/111 |
| 5,880,917 A | 3/1999 | Casper et al. | |
| 5,903,424 A | * 5/1999 | Tailliet | ............... 361/111 |
| 6,211,769 B1 | * 4/2001 | Baldwin et al. | ............... 338/7 |
| 6,222,237 B1 | * 4/2001 | Lin | ............... 257/358 |
| 6,229,183 B1 | * 5/2001 | Lee | ............... 257/360 |
| 6,501,632 B1 | * 12/2002 | Avery et al. | ............... 361/111 |

FOREIGN PATENT DOCUMENTS

JP       11354303 A    * 12/1999

* cited by examiner

*Primary Examiner*—Eddie Lee
*Assistant Examiner*—Joseph Nguyen
(74) *Attorney, Agent, or Firm*—McGuireWoods LLP; William Sabo

(57) ABSTRACT

In order to divert damaging currents into an electrostatic discharge (ESD) protection device during an ESD event, a tungsten wire resistor is incorporated into a current path connected in parallel with the ESD protection circuitry. The tungsten wire resistor has linear current-voltage (IV) characteristics at low currents, and non-linear IV characteristics at high current levels. The width and length of the resistor is chosen so that the resistor experiences significant self-heating caused by the higher currents generated by the ESD event. At a higher current level, the resistor becomes hot and its resistance increases dramatically. As a result the voltage drop across it increases thus diverting excess current into the parallel connected ESD protection circuitry. This limits the current through the resistor and thereby protects circuit elements in series with the resistor.

20 Claims, 4 Drawing Sheets

TUNGSTEN HOT WIRE CURRENT LIMITER FOR ESD PROTECTION

BACKGROUND OF THE INVENTION

1. Field of the Invention

The present invention generally relates to electrostatic discharge protection (ESD) and, more particularly, to a hot-wire tungsten resistor used as a current limiter to protect circuits from ESD damage.

2. Description of the Related Art

As electronic components are getting smaller and smaller along with the internal structures in integrated circuits, it is getting easier to either completely destroy or otherwise impair electronic components. In particular, many integrated circuits are highly susceptible to damage from the discharge of static electricity, even at levels which can neither be seen nor felt. Electrostatic discharge(ESD)is the transfer of an electrostatic charge between bodies at different electrostatic potentials (voltages), caused by direct contact or induced by an electrostatic field. The discharge of static electricity, or ESD, has become a critical problem for the electronics industry. Device failures are not always immediately catastrophic. Often the device is only slightly weakened but is less able to withstand normal operating stresses and, hence, may result in a reliability problem.

The amount of static charge generated through the process of friction and separation will be influenced by the extent of the contact, the materials involved, relative humidity, and the texture of the materials. Static charges of up to 30,000 Volts are not uncommon and can be generated by the simple act of walking across a floor; yet a discharge of only 10 Volts can destroy a Class 0 ESD sensitive device. Thus much effort has been expended by industry to protect electronic devices from ESD damage.

In order to protect output drivers, ESD protection devices are often employed at the pads to shunt the ESD discharge away from the output circuitry. However, the breakdown voltage of the output drivers may be lower than the clamping voltage of the ESD circuitry. Therefore, an ESD generated current may flow through the output driver in parallel to the ESD circuitry. It is desirable to minimize the current in the driver and maximize the current in the ESD circuitry.

Adding a resistor in series with the output driver increases the voltage drop through the driver and forces more current to flow in the ESD circuit, however, this resistor cannot be made too large or it will decrease output current drive. A current limiting device that exhibits a low impedance at low current levels but a higher impedance at high current levels would be useful to limit ESD current in the driver without impairing circuit operation. Thus a device that has linear current-voltage (IV) characteristics at low currents, and non-linear IV characteristics at high current levels is desirable.

U.S. Pat. No. 5,051,860 to Lee et al. shows such a device comprising a resistor device in parallel with an ESD protection device. In a first resistance mode during normal operations, the resistor device acts to have a low resistance value and thus introduces virtually no additional load to the input/output (I/O) circuitry. In a second mode of operation, during an ESD discharge, the resistor has a second significantly higher resistance which reduces current values during the ESD event to thereby protect the I/O circuitry. However, the resistor device is fairly complicated requiring a lattice of connected semiconductor resistors, the current path through which is controlled by a plurality of transistors. This greatly adds to the overhead of the device and therefore a simpler resistor having similar characteristics is desirable.

SUMMARY OF THE INVENTION

It is therefore an object of the present invention to provide a simplified resistor that has linear IV characteristics at low currents, and non-linear IV characteristics at high current levels to protect electronic components from ESD events.

According to the invention, a tungsten wire resistor is placed in parallel with ESD protection circuitry and may be incorporated as a metalization layer on a chip. The width and length of the resistor is chosen so that the resistor experiences significant self-heating at the current level where current limiting and non-linearity is desired. At this current level, the resistor becomes hot and its resistance increases dramatically. As a result the voltage drop across it increases and excess current caused by the ESD event is diverted to the parallel connected ESD protection circuitry where it can be safely dissipated. The resistance and the voltage drop increases until the fusing point of the wire is reached. In this manner, the tungsten wire resistor has linear IV characteristics at low currents, and non-linear IV characteristics at high current levels to protect electronic components connected in series with the resistor during ESD events.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
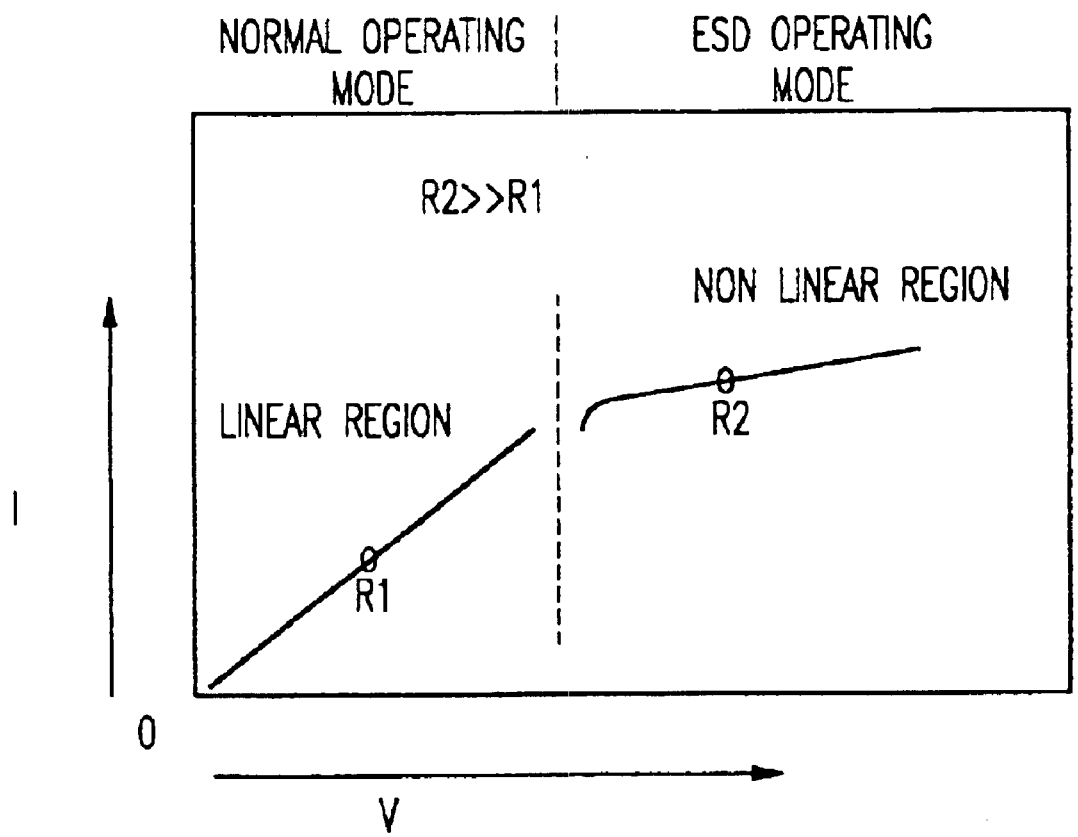
FIG. 1 is graph showing the current-voltage (IV) characteristics of the tungsten wire resistor according to the present invention.

Referring now to the drawings, and more particularly to FIG. 1, there is shown a graph demonstrating the desired characteristics of a resistor according to the present invention. In a normal operating mode the resistor should operate in a linear region having a linear current-voltage (IV) relationship. However, during an ESD event when voltage surges, the resistor needs to operate in a non-linear region. That is, in the non-linear mode, the resistance of the resistor increases (R1>>R2) thus suppressing higher currents at higher voltages.

Figure 2:
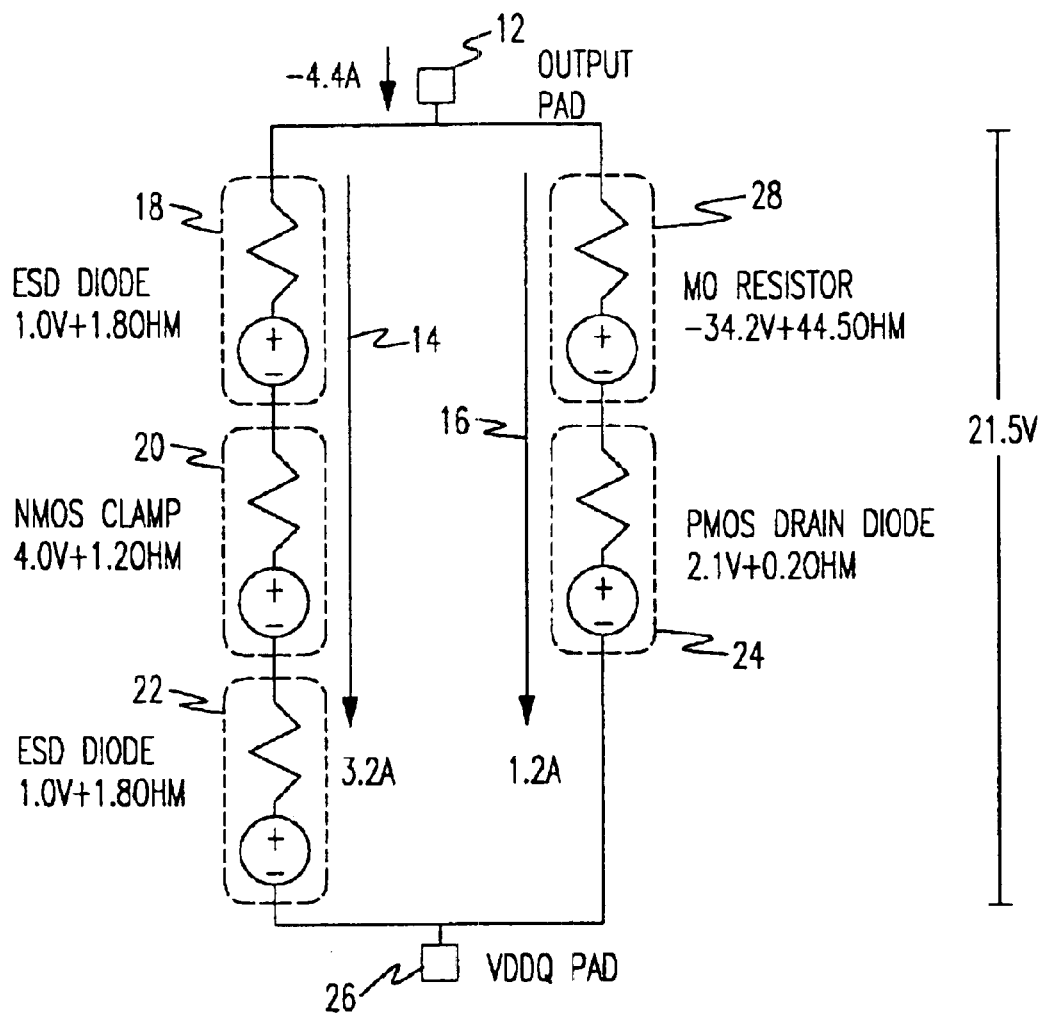
FIG. 2 is a linearized model of the ESD circuit and output driver circuit according to the present invention.

FIG. 2 shows an output buffer 10 comprising ESD protection circuitry connected to a circuit pad DQ 12. Current through the buffer 10, and thus to the DQ pad itself, is divided between two possible parallel paths; an ESD protection path 14 or the off-chip driver(OCD)path 16 (also known as the output driver), as indicated by the respective arrows. The ESD protection path 14 comprises ESD protection circuitry. There are many ESD protection devices known in the art which may be suitable. For example, as shown in FIG. 2 the ESD protection path comprises a first ESD diode 18, a grounded NMOS clamping transistor 20, and a second ESD diode 22. The output driver path comprises a PMOS drain diode 24 which, during normal operation drives a signal between the DQ pad 12 and the Vddq pad 26. In addition, a tungsten wire resistor 28 is placed in series with the PMOS drain diode 24.

The width and length of the tungsten wire resistor 28 is chosen so that the resistor 28 experiences significant self-heating at the current level where current limiting and non-linearity is desired. At this current level, the resistor 28 becomes hot and its resistance increases dramatically. As a result the voltage drop across it increases. The resistance and the voltage drop increases until the fusing point of the tungsten wire is reached. This gives the tungsten resistor 28 the properties of a non-linear current limiter.

In operation, during an ESD event, there are two parallel paths for the ESD current. The particular case of a positive discharge on the DQ (output) pad with the Vddq pad grounded is discussed. The first path is through an ESD diode 18, then through the NMOS power bus clamp 20, then through a second ESD diode 22, to the Vddq pad 26. This is the preferred current path, as it shunts the current away from the output circuitry, and is depicted as the left branch in FIG. 2. The second path is through the metal resistor 28, and then through the drain-to-well diode of the PMOS output transistor 24, to the Vddq pad 26. It is desired to limit the ESD current in this path to protect the PMOS output transistor 24. During normal circuit operation, both ESD diodes 18 and 22 are reverse biased, and no current flows in the ESD circuit 14. The output drive current flows from the output transistors through the metal resistor 28 to the output pad 26.

As noted above, according to the invention, a tungsten wire resistor 28 is used in series with a circuit to be protected and in parallel to the ESD protection circuitry. The width and thickness of the tungsten wire chosen so that fusing current of the resistor is the same or less than the failure current of the circuit to be protected. The length of the tungsten wire is chosen so the low-current resistance does not exceed the maximum series resistance allowed by the circuit design. Further, the voltage drop of the ESD circuit under maximum ESD stress must be designed to be less than the voltage drop across the tungsten wire plus the series circuit at the tungsten wire's fusing current. This ensures that the wire will not fuse under maximum ESD stress.

An exemplary design was calculated using experimental verification utilizing transmission line pulse (TLP) characterization of tungsten resistor tests structures and the design of the Orion DRAM chip (an IBM 256M DRAM chip manufactured in a 175 nm semiconductor technology).

Figure 3:
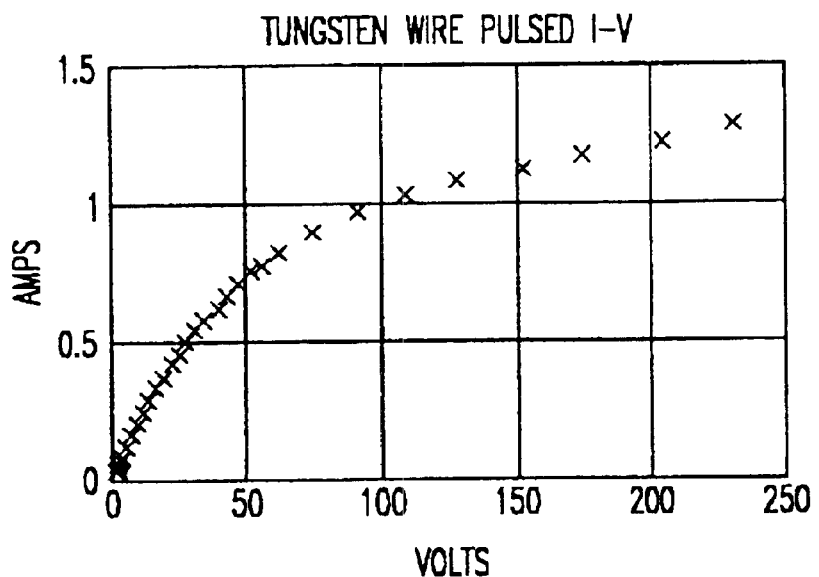
FIG. 3 is a graph showing the I–V characteristics of transmission line pulse test data for a tungsten resistor comprising 16 parallel 1×227 $\mu$m wires.

FIG. 3 shows the pulsed I–V data for a tungsten resistor from TLP measurements using 100 ns pulses. The test resistor comprised of 16 parallel wires 1 $\mu$m thick and 227 $\mu$m wide. Self-heating causes the dynamic resistance to increase from 5 ohms at low currents to 45 ohms near the fusing current of 1.22 A, nearly an order of magnitude increase. This increase is due to the self-heating of the tungsten wire combined with its thermal coefficient of resistance.

Figure 4:
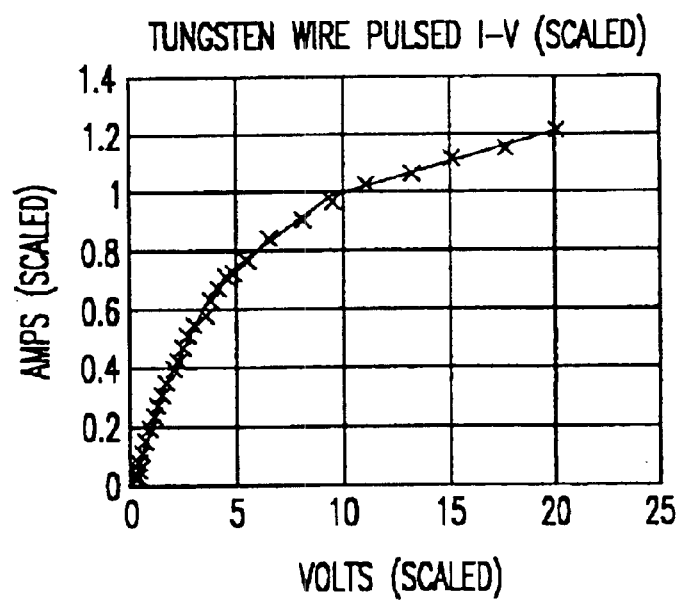
FIG. 4 is the data from FIG. 3 scaled to determine the dimensions for an exemplary tungsten resistor used to protect a DRAM circuit.

Referring again to FIG. 2, the design goal was to limit the current in the OCD circuit to less than 1.25 A. Since the fusing current shown in FIG. 3 was 1.3 A, the resistor was scaled to 15 $\mu$m width to give a fusing current of 1.22 A. The length was scaled by $\frac{1}{11.5}$ to give a nominal resistance of 5 ohms, which was established by circuit requirements. The scaled I–V curves representing the resistor to be used in the design is shown in FIG. 4. As scaled, the non-linear properties of the tungsten wire resistor begin at about 10 Volts, suitable for protecting even a Class 0 ESD sensitive device.

Scaling refers to the amount of current carried by the metal resistor being proportional to its width. Likewise, the voltage dropped across the resistor is proportional to its length. The maximum current the resistor can carry is also proportional to its width, while the maximum voltage the resistor can withstand is proportional to its length. Therefore, the resistor can be "scaled" to meet any desired current or voltage conditions. Given the current-voltage data from a sample resistor shown in FIG. 3, the desired maximum current of the resistor can be set by proportionally increasing or decreasing its width compared to the sample resistor. Likewise, the desired maximum voltage of the resistor can be set by proportionately increasing or decreasing its length compared to the sample resistor.

At the fusing current of 1.22 A, the voltage drop across the resistor is 20V. As noted above, the voltage drop through the ESD circuit must be less than voltage drop through the tungsten resistor and the output circuit at the fusing current of the resistor. This is confirmed using the PWL fit to the scaled data in FIG. 4 in conjunction with linearized models of the ESD circuit and output driver circuit shown in FIG. 2. The zap mode that is modeled is a positive zap on the output with respect to Vddq, which placed the maximum stress on the tungsten resistor.

With regard to the zap mode referred to above, during ESD testing, a succession of current pulses designed to stimulate ESD discharges are applied to each pin of the IC chip. Each power supply of the chip is grounded, one at a time, and one or more positive and negative discharges (zaps) are applied to the pin being tested. When the pin has been zapped with respect to each power supply (that is, each power supply was grounded while the pin was zapped), all the other input/output (I/O) pins are grounded except the pin being tested, and positive and negative zaps are applied again. A "zap mode" is one of these test configurations, with a particular choice of power supply or I/O pins being grounded while the pin under tests is being zapped.

Figure 5:
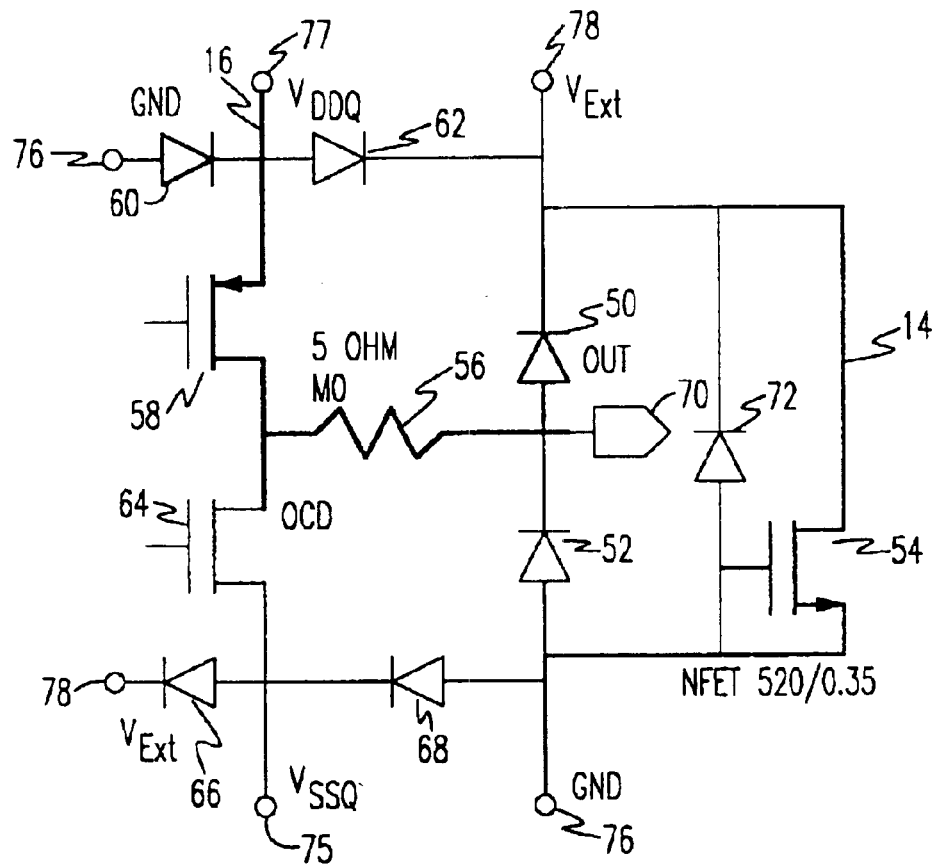
FIG. 5 is an actual circuit designed to realize the linearized model shown in FIG. 2.

The schematic of the actual circuit is shown in FIG. 5. An ESD diode 50 is connected between output pad 70 and Vext pad 78. A second ESD diode 52 is connected between output pad 70 and Gnd pad 76. A grounded gate NMOS clamp 54 is connected between the Vext power bus 78 and the Gnd bus 76 and is used to limit the voltage on Vext during an ESD discharge. A metal resistor 56, limits ESD current flowing through output transistors 58 and 64. An ESD diode 60 between Gnd pad 80 and Vddq pad 77 is used to connect the various power supplies in such a way to provide a complete ESD path between all the pads on the chip. ESD diode 62 connects between Vddq pad 77 and Vext pad 78, ESD diode 66 connects Vssq 75 to Vext 78, and ESD diode 68 connects Gnd 71 to Vssq 75. A set of normally reverse biased diodes 72 between Vext 74 and Gnd is formed by all the Nwells that are tied to Vext to the P-type substrate, and is also formed by the well to drain diode in NMOS clamp 54. The Vext pad 74 supplies power which powers the chip. Vddq is the power supply for the output transistors, and Vssq is the ground or return for the Vddq supply. Separate output supplies are used to keep the electrical noise from the outputs away from the rest of the circuitry.

Two parallel current paths are present in this circuit when the output 70 is tapped positive with respect to Vddq 77. The first is through two ESD diodes 50 and 60 and a grounded gate NMOS clamp 54. The second is through the tungsten resistor 56 and the drain-body diode of the PMOS driver 58. FIG. 2 shows the voltage across the parallel circuit and currents through each leg 14 and 16 when the tungsten resistor is conducting 1.2 A, which is just below its fusing point. 21.5V will be dropped across the OCD circuit, and the ESD circuit will carry 3.2 A. The total current is 4.4 A, which corresponds to the peak current of a 6.6 KV HBM discharge or a 300V MM discharge. HBM refers to the "human body model" which is one of the standard types of ESD tests. It simulates a person charged with static electricity touching a chip and discharging through it.

As these values are above design requirements, the requirements of step 4 are met. The tungsten resistor will limit the OCD current to a safe level, and the ESD circuit will limit the voltage below the fusing point of the resistor.

Figure 6:
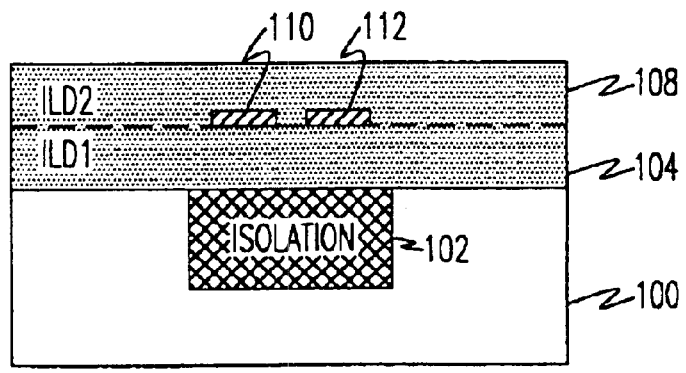
FIG. 6 is a chip having the tungsten wire resistor of the present invention incorporated as a metalization layer on the chip.

Referring to FIG. 6, to further enhance the non-linear property, the resistor can be fabricated in an environment where the thermal path over substrate is purposely increased, i.e. over an isolation region. The metal resistor comprises one or more metal strips 110 and 112. The metal is on top of interlayer dielectric (ILD1) 104, and is covered by interlayer dielectric (ILD2). Interlayer dielectric is usually glass (silicon dioxide), possibly with other materials added to modify its properties. The metal resistor may be placed over an isolation region 102, such as a shallow trench isolation, deep trench isolation, or LOCOS isolation. The isolation region is a region of oxidized silicon or some other dielectric material. The chip is formed in silicon substrate 100.

Other metals beside tungsten may be suitable. Many metals exhibit self heating properties with associated increase in resistance; for example, similar metals with high melting temperatures, such as tantalum or titanium which also have a positive thermal coefficient of resistance. Metallic compounds such as the nitrides of tungsten, tantalum and titanium are also possible. The inventors have designed an aluminum wire resistor using the same principles to limit ESD current on an experimental chip. The advantage of tungsten is that it melts at very high temperatures, so the resistor is likely to survive the ESD test without incurring damage that may affect reliability later on. An aluminum wire will go right to the melting point and may actually melt during the ESD discharge and re-solidify afterwards. This actually results in good current limiting properties because metals are much more resistive when molten. However, it is probably not suitable for long term reliability.

While the invention has been described in terms of a single preferred embodiment, those skilled in the art will recognize that the invention can be practiced with modification within the spirit and scope of the appended claims.

We claim:

1. A circuit comprising:
   a first terminal;
   a second terminal;
   an electrostatic discharge (ESD) network serially coupled between said first terminal and said second terminal; and
   a resistance device and a circuit to be protected connected in series and coupled between said first terminal and said second terminal in parallel with said ESD network, wherein said resistance device has a resistance that increases with heating of said resistance device.

2. The circuit as recited in claim 1, further comprising: a substrate having electronic circuitry formed thereon; and
   said resistance device comprising a dielectric layer on the substrate having interconnect wiring therein for interconnecting the electronic circuitry, the interconnect wiring including a metal wire whose resistance increases in response to increasing current there through self-heating wherein the increasing current is diverted from traveling through the metal wire.

3. The circuit as described in claim 1, wherein said resistance device has a resistance that increases with heating to increase a resistance value for diverting current into the ESD network and away from said circuit to be protected.

4. The circuit as described in claim 1, wherein said resistance device heats in response to increasing current through said device so it is self-heating.

5. The circuit as recited in claim 4, wherein said self-heating resistance device comprises a tungsten wire.

6. The circuit as recited in claim 4, wherein said self-heating resistance device comprises a material having a positive thermal coefficient of resistance.

7. The circuit as recited in claim 4, wherein the circuit to be protected is on an integrated circuit chip and wherein said increasing current is caused by an electrostatic discharge (ESD) event on said integrated circuit chip.

8. The circuit as described in claim 1, wherein said resistance device comprises a metal wire, and
   a self-heating resistance device connected in parallel with said ESD network between said first terminal and said second terminal,
   wherein said resistance device heats in response to increasing current to increase a resistance value for diverting the increasing current into the ESD network.

9. The circuit as recited in claim 8, wherein the metal wire comprises a positive thermal coefficient of resistance.

10. The circuit as recited in claim 9, wherein the metal wire is made from a metal selected from the group consisting of tungsten, tantalum and titanium.

11. The circuit as recited in claim 9, wherein the metal wire is made from a metal selected from the group consisting of nitrides of tungsten, tantalum and titanium.

12. The circuit of claim 1, wherein the ESD network comprises three serially connected components.

13. The circuit of claim 12, wherein the ESD network includes at least two diodes.

14. The circuit of claim 12, wherein the ESD network includes a transistor serially connected between two diodes.

15. An electrostatic discharge (ESD) protection device, comprising:
   a first terminal;
   a second terminal;
   an electrostatic discharge (ESD) network serially coupled between said first terminal and said second terminal; and
   a self-heating resistance and an ESD sensitive circuit coupled between said first terminal and said second terminal in parallel with said ESD network,
   wherein said resistance device heats in response to increasing current to increase a resistance value for diverting the increasing current into the ESD network and away from the ESD sensitive circuit.

16. The electrostatic discharge (ESD) protection device as recited in claim 15, wherein said self-heating resistance device comprises a tungsten wire.

17. The electrostatic discharge (ESD) protection device as recited in claim 15, wherein said self-heating resistance device is made from a metal selected from the group consisting of tungsten, tantalum, titanium and nitrides thereof.

18. A circuit comprising:

a first terminal;

a second terminal;

an electrostatic discharge (ESD) network serially-connected between said first terminal and said second terminal; and a self-heating resistance device coupled between said first terminal and said second terminal in a parallel path with said ESD network, wherein said resistance device exhibits linear current-voltage (IV) characteristics at low currents, and non-linear IV characteristics at high current levels to increase a resistance value to divert electrostatic discharge to said ESD network.

19. The circuit as recited in claim 18, wherein said self-heating resistance device comprises a tungsten wire.

20. The circuit as recited in claim 18, wherein said self-heating resistance device comprises a material having a positive thermal coefficient of resistance.

* * * * *